United States Patent
Zota et al.

(10) Patent No.: US 12,191,382 B2
(45) Date of Patent: Jan. 7, 2025

(54) HIGH ELECTRON MOBILITY TRANSISTOR WITH SOURCE AND DRAIN ELECTRODES BELOW THE CHANNEL

(71) Applicant: INTERNATIONAL BUSINESS MACHINES CORPORATION, Armonk, NY (US)

(72) Inventors: Cezar Bogdan Zota, Rueschlikon (CH); Thomas Morf, Ruschlikon (CH); Eunjung Cha, Adliswill (CH); Peter Mueller, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 457 days.

(21) Appl. No.: 17/542,485

(22) Filed: Dec. 5, 2021

(65) Prior Publication Data
US 2023/0178642 A1    Jun. 8, 2023

(51) Int. Cl.
*H01L 29/778*  (2006.01)
*H01L 29/12*   (2006.01)
*H01L 29/66*   (2006.01)

(52) U.S. Cl.
CPC ........ *H01L 29/7783* (2013.01); *H01L 29/122* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 4,958,203 A | 9/1990 | Takikawa | |
| 5,296,395 A | 3/1994 | Khan et al. | |
| 8,169,002 B2 | 5/2012 | Chang et al. | |
| 8,304,811 B2 | 11/2012 | Zhang | |
| 9,425,276 B2 | 8/2016 | Liu et al. | |
| 9,548,376 B2 | 1/2017 | Liu et al. | |
| 10,186,514 B1 * | 1/2019 | Tao | H01L 29/41708 |
| 2007/0200142 A1 * | 8/2007 | Lee | H01L 29/7784 |
| | | | 257/192 |

(Continued)

FOREIGN PATENT DOCUMENTS

| | | |
|---|---|---|
| CN | 109 037 065 A | 12/2018 |
| EP | 0266166 B1 | 1/1993 |

(Continued)

OTHER PUBLICATIONS

Wichmann et al. "InAlAs—InGaAs Double-Gate HEMTs on Transferred Substrate", IEEE Electron Device Letters, vol. 25, No. 6, (Jun. 2004), 3 pages. (Year: 2004).*

(Continued)

*Primary Examiner* — Scott B Geyer
(74) *Attorney, Agent, or Firm* — Intelletek Law Group, PLLC; Gabriel Daniel, Esq.

(57) ABSTRACT

A superconductor transistor structure includes a source electrode and a drain electrode on a same plane as the source electrode. There is a channel region on top of the source and drain electrodes and configured to carry a current. A gate structure comprising a metallic material is on top of the channel region. The source and drain are located on a side that is opposite to that of the gate structure, with respect to the channel region.

18 Claims, 11 Drawing Sheets

(56) References Cited

U.S. PATENT DOCUMENTS

| | | | |
|---|---|---|---|
| 2009/0072272 A1* | 3/2009 | Suh | H01L 29/778 |
| | | | 257/E21.409 |
| 2010/0032717 A1* | 2/2010 | Palacios | H01L 29/7783 |
| | | | 257/E21.403 |
| 2010/0219452 A1 | 9/2010 | Brierley | |
| 2011/0006345 A1* | 1/2011 | Ota | H01L 29/41741 |
| | | | 257/E21.441 |
| 2012/0256296 A1* | 10/2012 | Wei | H10K 85/221 |
| | | | 977/734 |
| 2012/0326126 A1* | 12/2012 | Chen | H01L 29/1606 |
| | | | 977/734 |
| 2013/0032860 A1* | 2/2013 | Marino | H01L 29/7783 |
| | | | 257/E21.403 |
| 2013/0161698 A1* | 6/2013 | Marino | H01L 29/1029 |
| | | | 257/E21.403 |
| 2016/0155839 A1* | 6/2016 | Strachan | H01L 29/24 |
| | | | 257/29 |
| 2019/0013408 A1* | 1/2019 | Xie | H01L 21/0259 |
| 2019/0097059 A1* | 3/2019 | Kikuchi | H01L 29/7869 |
| 2020/0091306 A1* | 3/2020 | Heo | H01L 29/1606 |
| 2020/0328108 A1 | 10/2020 | Walke et al. | |

FOREIGN PATENT DOCUMENTS

| | | |
|---|---|---|
| EP | 1 659 622 A2 | 5/2006 |
| JP | 4492034 B2 | 6/2010 |

OTHER PUBLICATIONS

Wichmann, N. et al., "InAlAs/InGaAs Double-Gate HEMTs with High Extrinsic Transconductance", 2004 International Conference on Indium Phoshide and Related Materails Conference Proceedings (2004), Kagoshima, Japan, pp. 295-298.

* cited by examiner

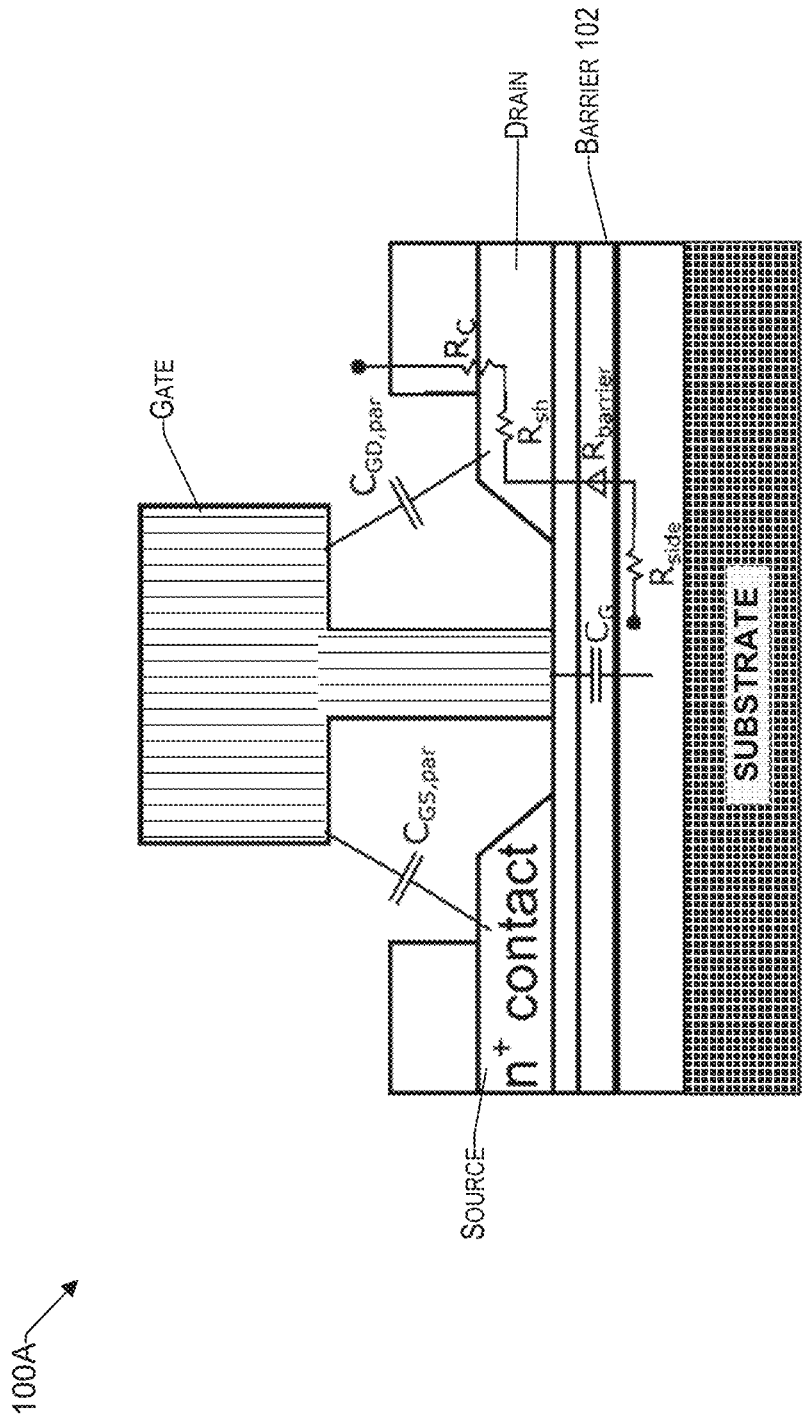
FIG. 1A: Prior Art

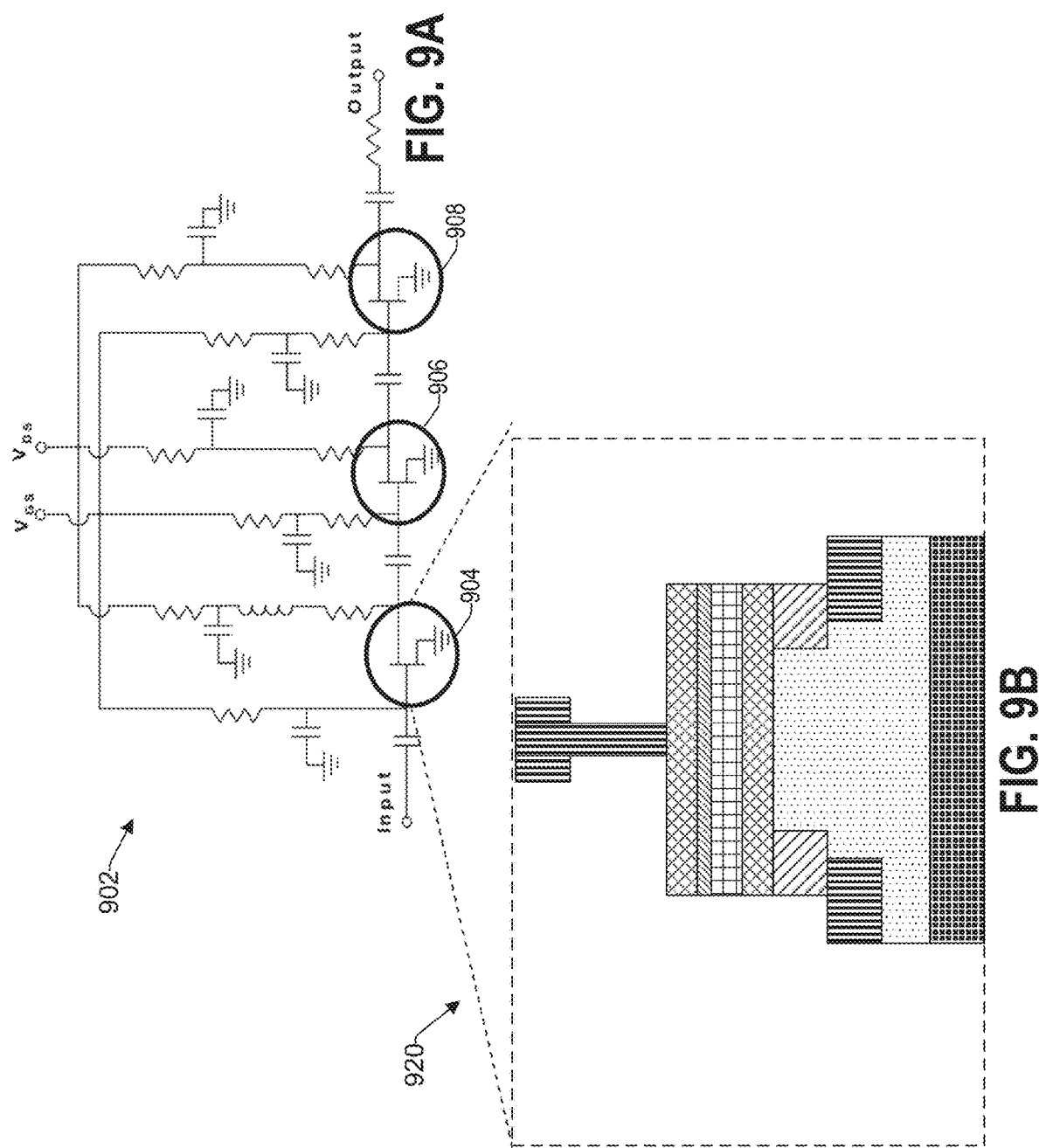

HIGH ELECTRON MOBILITY TRANSISTOR WITH SOURCE AND DRAIN ELECTRODES BELOW THE CHANNEL

BACKGROUND

Technical Field

The present disclosure generally relates to semiconductor structures, and more particularly, to semiconductor transistor structures and methods of creation thereof.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various components, such as low-noise amplifiers, that may operate in different thermal isolation stages, can be used to communicate with qubits. Many quantum phenomena, such as superposition and entanglement, do not have analogs in the world of classical computing and therefore may involve special structures, techniques, and materials.

SUMMARY

According to an embodiment, a semiconductor transistor structure includes a source electrode, a drain electrode on a same plane as the source electrode, a channel region on top of the source and drain electrodes and configured to carry a current. A gate structure includes a metallic material on top of the channel region. The source and drain electrodes are located on a side that is opposite to that of the gate structure, with respect to the channel region.

In one embodiment, the channel region comprises indium gallium arsenide (InGaAs).

In one embodiment, there is a substrate configured as a chip carrier. An oxide layer is on top of the chip carrier substrate. The source and drain electrodes are on top of the chip carrier substrate, and the source and drain electrodes are on a left and a right side of the oxide layer, respectively.

In one embodiment, a first N+ contact is on top of the source electrode, and a second N+ contact on top of the drain electrode.

In one embodiment, a first buffer layer is on top of the oxide and source and drain contacts and below the channel region.

In one embodiment, the first buffer layer includes indium phosphide (InP).

In one embodiment, a gate barrier is on top of the channel region. There is a second buffer layer on top of the gate barrier and below the gate structure.

In one embodiment, the gate barrier comprises indium aluminum arsenide (InAlAs).

In one embodiment, the second buffer layer comprises indium phosphide (InP).

In one embodiment, the gate structure is T shaped.

In one embodiment, the semiconductor transistor structure is a high-electron-mobility transistor (HEMT) and part of a low noise amplifier configured to operate in a cryogenic environment.

According to one embodiment, a method of fabricating semiconductor transistor structure, includes providing a first substrate. A first buffer layer is provided on top of the first substrate. A gate barrier layer is provided on top of the first buffer layer. A quantum well channel layer is provided on top of the gate barrier layer. A second buffer layer is provided on top of the quantum well channel layer. A contact layer is provided on top of the second buffer layer. A first photoresist layer having a pattern is provided on top of the contact layer, to define an etch gate recess region. A center portion of the contact layer below the photoresist pattern is removed, thereby defining a source and a drain on the contact layer. The first photoresist is removed. An electrode is deposited on the drain contact and an electrode on the source contact. An oxide layer is deposited on top of the source and drain electrodes, and the buffer layer. The oxide layer is then planarized. The transistor structure is flipped and directly bonded to a carrier substrate. The first substrate is removed, thereby exposing the first buffer layer. A second photoresist layer having a pattern is provided on top of the exposed first buffer layer. A metal gate structure is deposited on top of the exposed first buffer layer.

In one embodiment, the quantum well channel comprises indium gallium arsenide (InGaAs).

In one embodiment, alignment markers are used for the deposition of the electrodes on the drain and source contacts.

In one embodiment, the direct bonding to the carrier substrate includes covering at least one of a surface of the oxide layer or the carrier substrate with a layer of adhesive oxide. The flipped semiconductor structure is aligned with the carrier substrate. The flipped semiconductor structure is bonded with the carrier substrate to create a combined structure. The combined structure is then annealed to create a covalent bond between the oxide layer and the carrier substrate.

In one embodiment, the quantum well channel layer comprises indium gallium arsenide (InGaAs).

In one embodiment, the first buffer layer comprises indium phosphide (InP).

In one embodiment, the gate barrier layer comprises indium aluminum arsenide (InAlAs).

In one embodiment, the second buffer layer comprises indium phosphide (InP).

In one embodiment, the gate structure is configured to have a T shape.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1A is an example high-electron-mobility transistor (HEMT) having various parasitic components.

FIG. 9A provides an example low noise amplifier circuit that may use one or more transistors similar to that of FIG. 8, consistent with an illustrative embodiment.

FIG. 9B is a simplified cross-section view of a semiconductor field-effect transistor, consistent with an illustrative embodiment.

DETAILED DESCRIPTION

Overview

Figure 1B:
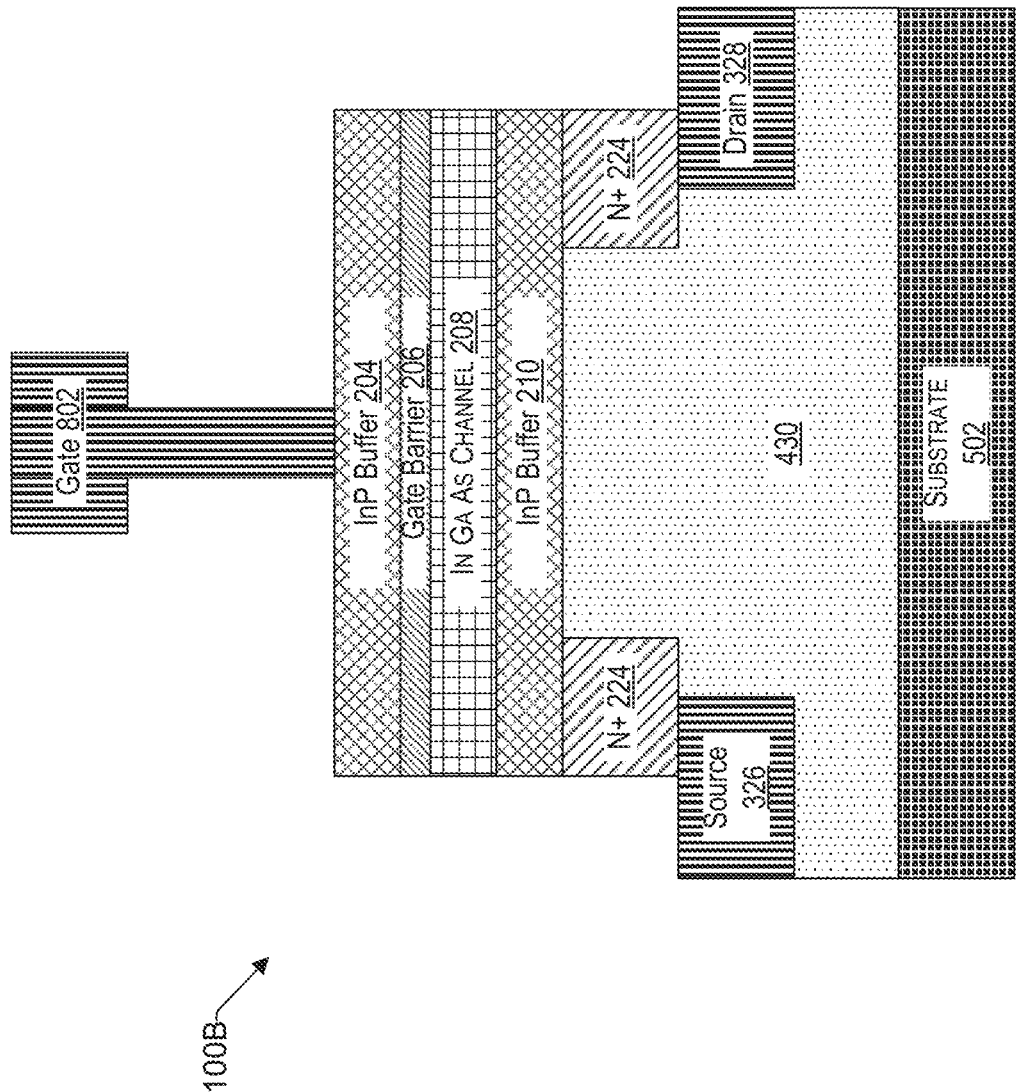
FIG. 1B is a simplified cross-section view of a gate semiconductor field-effect transistor, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to quantum technology and quantum chips. Regarding quantum technology, the electromagnetic energy associated with a qubit can be stored, for example, in so-called Josephson junctions and in the capacitive and inductive elements that are used to form the qubit. In other examples, there may be spin qubits coupled to resonators or topological qubits, microfabricated ion traps, etc. Other types of superconducting components are supported by the teachings herein as well, including (without limitation), circulators, isolators, amplifiers, filters, active control electronics such as rapid single flux quantum (RSFQ), etc.

In one example, to read out the qubit state, a microwave signal is applied to the microwave readout cavity that couples to the qubit at the cavity frequency. The transmitted (or reflected) microwave signal goes through multiple thermal isolation stages and low-noise amplifiers (LNAs) that are used to block or reduce the noise and improve the signal-to-noise ratio. Alternatively, or in addition, a microwave signal (e.g., pulse) can be used to entangle one or more qubits. Much of the process is performed in a cold environment (e.g., in a cryogenic chamber), while the microwave signal of a qubit is ultimately measured at room temperature.

The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain.

The inventors have recognized that to increase the computational power and reliability of a quantum computer in general, improvements can be made in semiconductor device structures and manufacture of the same. Achieving low error rates and better reliability is relevant, among other aspects, to manipulate qubit states accurately and perform sequential operations that provide consistent results and not merely unreliable data. Quantum technology is still a developing field and providing structures with highly predictable and more ideal performance is a challenge. Scalability of quantum computers going beyond a few hundred qubits with regard to the classical electronics used to read qubits limits the power consumption of low-noise amplifiers, due to the limited cooling power in cryogenic systems. When LNAs operate at extremely low (e.g., <1 mW) power levels, the noise temperature degrades because the gain of an active component in the LNA decreases. For example, 1,000 qubit systems may require at least 100 LNAs, each consuming approximately 5 mW of power. As the number of qubits increase in a system, the power burden in a cryogenic environment may be too high.

A conventional high-electron-mobility transistor (HEMT), sometimes also referred to as heterostructure FET (HFET) or modulation-doped FET (MODFET), is a field-effect transistor that includes a junction between two materials with different band gaps (i.e., a heterojunction) as the channel instead of a doped region.

To avoid a trade-off between the power consumption and noise properties of transistors of circuits that support quantum technology, such as LNAs, efforts to optimize the noise properties for ultra-low power LNAs are salient. Equation 1 below provides a maximum oscillation frequency of a transistor that, for example, can be used in an LNA. Equation 1 below provides the highest frequency at which you can have power gain.

$$f_{max} = \sqrt{\frac{f_T}{8\pi R_G C_{gd}\left[1 + \frac{2\pi f_T}{C_{gd}}\right]\Psi}}$$

Where:
$R_G$ is a resistance of the gate;
$C_{GD}$ is a gate to drain capacitance;
$f_T$ is a transition frequency; and
$\Psi$ represents a complex function of parasitics.

The expression of equation 1 reveals that to achieve optimal gain in an LNA, in one embodiment, both the parasitic capacitances and resistances should be minimized. For example, a low parasitic resistance and capacitance can provide a low noise performance, which is a salient parameter for scalability of quantum computers.

LNAs that operate in cryogenic environments are typically tailored for low temperature by bias point tuning and circuit design. The noise temperature of the HEMT is provided by the expressions below:

$$T_{min} \approx 2\frac{f}{f_T}\sqrt{(R_G + R_S + R_i)T_g T_d G_d} \qquad (Eq.\ 2)$$

$$T_{min} \propto \frac{\sqrt{I_{DS}}}{g_m} \qquad (Eq.\ 3)$$

Where:
$T_{min}$ is the minimum noise temperature;
$R_S$ is the source resistance;
$R_i$ is the intrinsic gate-source resistance;
$T_d$ is the drain temperature;
$G_d$ is and the output conductance; and
$I_{DS}$ is the drain to source current.

It is difficult to reduce both power consumption and noise concurrently. In order to realize LNAs with sufficiently low noise temperature under ultra-low power operation, the inventors have identified that the parasitic source resistance should be minimized, since any excessive resistance contributes to the thermal noise and reduces the transistor gain.

To understand the benefits of the architecture discussed herein, it may be instructive to refer to a known cryogenic HEMT 100A, illustrated by way of example in FIG. 1A. Known cryogenic HEMTs typically have two main performance bottlenecks, namely: (i) access resistance (e.g., source resistance in equation 2), and (ii) parasitic capacitance. The access resistance is dominated by the tunneling barrier due to the gate barrier layer 102 (e.g., a wide bandgap material). FIG. 1 illustrates the distribution of the different components involved in $R_{access}$ by way of the percentages for each parameter of the HEMT 100. The inventors have recognized that it is difficult to mitigate the $R_{access}$ contribution in standard HEMTs.

As to the total gate capacitance $C_{G,total}$, it is a combination of the intrinsic gate capacitance, which controls the channel and parasitic contributions from coupling between gate and other conducting parts of the HEMT 100. The components and their corresponding percentage of contribution are provided as $C_{G,total}$ in FIG. 1

The teachings herein provide a semiconductor structure (e.g., HEMT) that removes the barrier 102 contribution to the access, and strongly reduces the parasitic gate capacitances. The parameters that are substantially reduced are provided in the dashed boxes in FIG. 1. The gain is inversely proportional to both these properties (i.e., $R_{access}$ and $C_{g,total}$), so an increase of $f_t/f_{max}$ by up to a factor 2 can be provided.

A low parasitic source resistance and gate capacitance achieve a low noise performance, low power consumption, and relatively high gain, thereby facilitating scalability of quantum computers that meet the demands of advanced transistor architectures, that can be used, for example, as high speed and low power LNAs. The techniques described herein may be implemented in a number of ways. Example implementations are provided below with reference to the following figures.

Example Superconducting Transistor Structure

Reference now is made to FIG. 1B, which is a simplified cross-section view of a semiconductor field-effect transistor 100, consistent with an illustrative embodiment. To facilitate the present discussion, the semiconductor structures herein will sometimes be discussed in the context of a HEMT, while it will be understood that other types of high frequency transistors, such as metal-oxide-semiconductor field-effect transistors are supported as well.

The teachings herein provide a transistor device, which may be a HEMT structure, wherein the source 326 and drain 328 contacts and electrodes 224 are located underneath the transistor channel 208, while the gate electrode 802 is located on top of the quantum well channel 208, sometimes referred to simply as the channel 208. In one aspect, the disclosure uses a special and novel heterostructure and a novel method to achieve this structure 100B. By virtue of separating the gate 802 and contacts (i.e., drain and source 326, 328) to different sides of the quantum well channel 208, various device performance advantages are provided, as discussed below. In one embodiment, the channel comprises indium gallium arsenide (InGaAs).

The semiconductor structure 100B, may include a substrate 102. In various embodiments, the substrate 502, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), a superconducting alloy of silicon and germanium, quartz, etc. Thus, as used herein, the term substrate 502 refers to a foundation upon which various superconducting structures can be built.

There is an oxide structure 430, which may be $SiO_2$, having a pyramid shape on top of the substrate and operative to couple the drain, source, gate 802, channel 208 structures to the carrier substrate 502. There is a source electrode 326 and a gate electrode 328 on a mutual plane. As illustrated in FIG. 1B, the source and drain electrodes 326 and 328 are on top of the chip carrier substrate 502. The source and drain electrodes are on the left and right side of the oxide layer 430, respectively.

There are first and second N+ contacts (224) on top of the source 326 and drain 328 electrodes, respectively. There is a first buffer layer 210 on top of the oxide and source and drain contacts 224 and below the channel region 208. In one embodiment, the first buffer layer comprises indium phosphide (InP). There is a gate barrier 206 on top of the gate channel 208 and a second buffer layer on top of the gate barrier 206 and below the gate structure 802. In one embodiment, the second buffer layer comprises indium phosphide (InP). While the transistor structure 100B is described as having a T shaped gate structure 802 by way of example, it will be understood that other types of gate structures are within the scope of the teachings herein. The structure 100B can be used to implement various components, including, without limitation, LNAs that operate in cryogenic environments, discussed in more detail later.

Example Processes for Semiconductor Structures

Figure 2A:
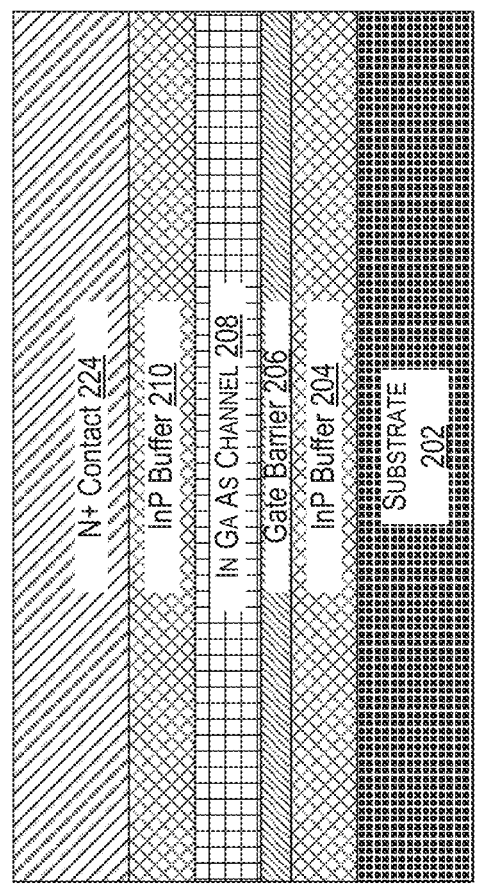
FIG. 2A is a cross-section of a semiconductor structure before formation of a gate, drain, or source, consistent with an illustrative embodiment.

With the foregoing description of an example semiconductor field-effect transistor 100B, it may be helpful to discuss an example process of manufacturing the same. To that end, FIGS. 2 to 8 illustrate various steps in the manufacture of a high electron mobility transistor, consistent with illustrative embodiments. More specifically, FIG. 2A illustrates a cross-section of a semiconductor structure 200A before formation of a gate, drain, or source, consistent with an illustrative embodiment. FIG. 2A includes a substrate 202 having various epitaxial layers. The epitaxial layers include a first buffer layer 204 on top of the substrate 202. For example, the first buffer layer may be indium phosphide (InP). In one embodiment, additional etch stop layers can be added underneath the first buffer layer 204, such as InAlAs and/or InGaAs.

There is a gate barrier 206 on top of the first buffer layer 204 and configured to block the gate current from flowing. In various embodiments, the gate barrier may comprise, without limitation, indium aluminum arsenide (InAlAs), or other suitable material. There is quantum well channel layer 208 on top of the gate barrier 206. For example, the gate can control the mobility of this channel 208, thereby adjusting the current between the drain and source of the transistor. In one embodiment, the transistor channel layer comprises indium gallium arsenide (InGaAs). There is a second buffer layer 210 on top of the transistor channel layer 208 that is operative as an etch stop layer. There is an N+ contact layer 224 that is used to configure the source and drain regions of the transistor, discussed in more detail later. It is emphasized that, at this stage in the process, the gate barrier 206 is below this contact layer 224.

Figure 2B:
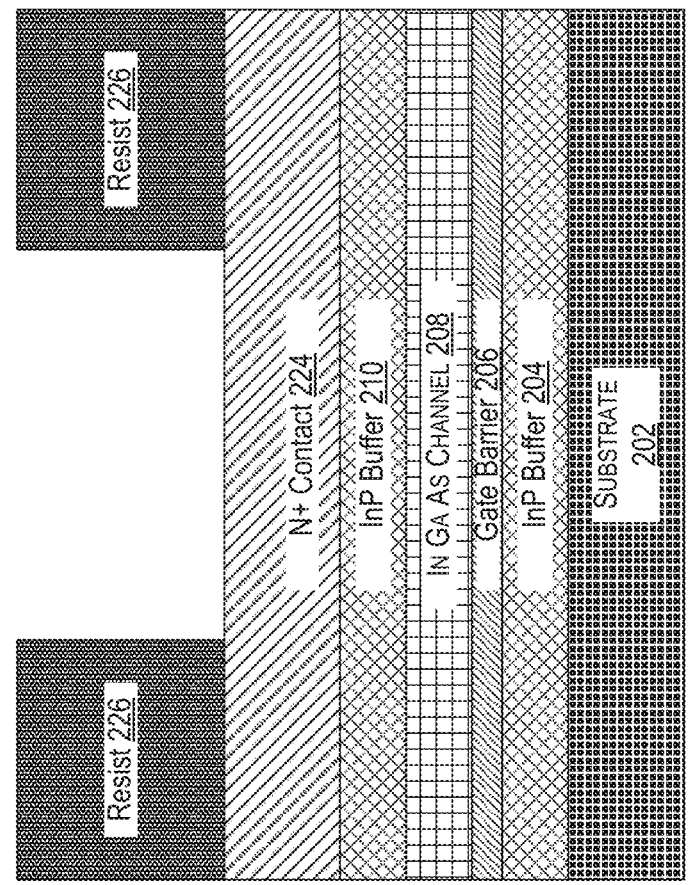
FIG. 2B is a cross-section of a semiconductor structure having a pattern of photoresist that is operative to define the etch gate recess, consistent with an illustrative embodiment.
Figure 3:
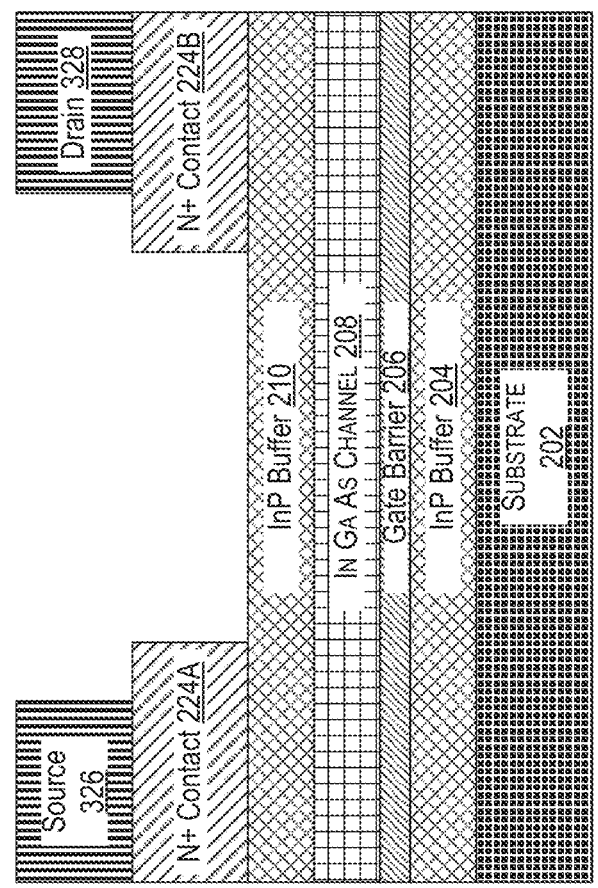
FIG. 3 is a cross-section view where the pattern of the photoresist is used to etch away a center portion of the contact to separate a drain from a source, consistent with an illustrative embodiment.

FIG. 2B is a cross-section of a semiconductor structure 200B having a pattern of photoresist that is operative to define the etch gate recess, consistent with an illustrative embodiment. The pattern of the photoresist 226 is used to etch away (e.g., wet etch) a center portion of the contact layer, thereby separating a left side (e.g., source) from the right side (e.g., drain), as illustrated in FIG. 3. In one embodiment, a source and drain can be created by way of evaporation and lift-off process. The source and drain contacts may have an ohmic metal, such as a combination of titanium and gold. The photoresist is stripped away and replaced with a source and drain on top of the left contact 224A and the right contact 224B. In one embodiment, alignment markers can be added by patterning them in the photoresist 226.

Figure 4:
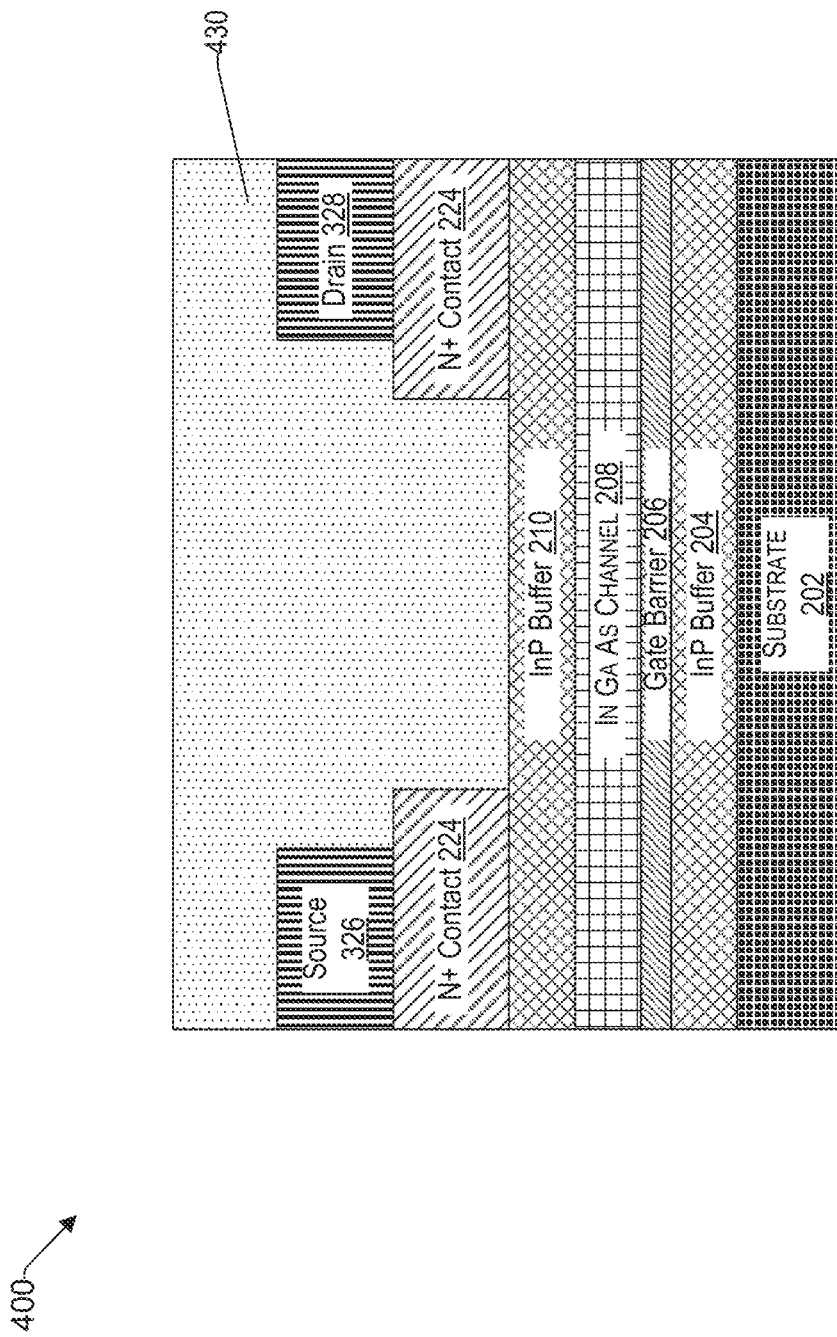
FIG. 4 is a cross-section view of a semiconductor structure after a deposition of an oxide, consistent with an illustrative embodiment.

FIG. 4 is a cross-section view of a semiconductor structure 400 after a deposition of an oxide (e.g., $SiO_2$) 430, consistent with an illustrative embodiment. The top surface of the oxide layer 430 is then planarized in preparation for the next step. In one embodiment, chemical-mechanical planarization (CMP) is used for the planarization.

Figure 5:
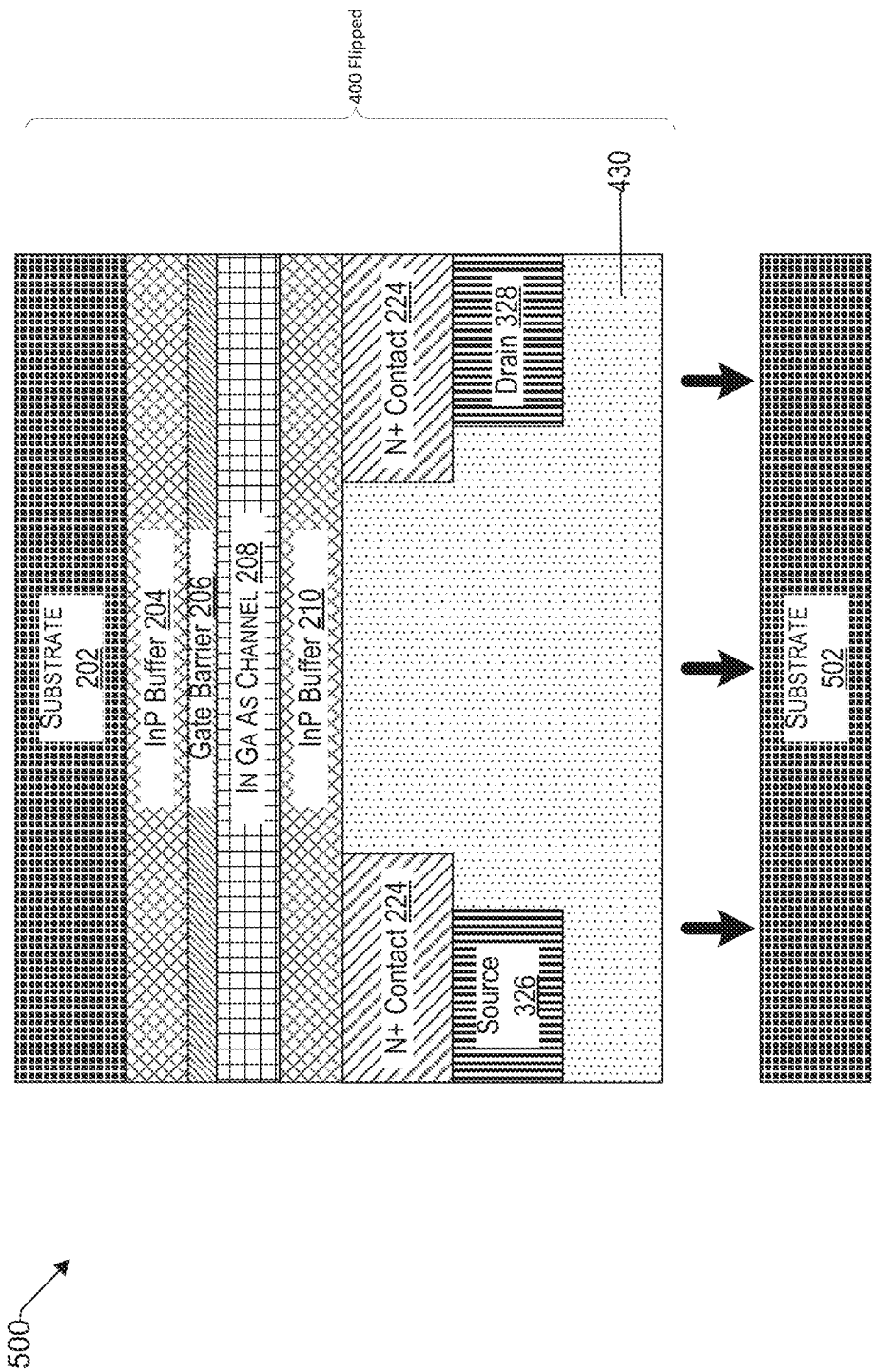
FIG. 5 is a cross-section view of a semiconductor structure that has been flipped and undergoing a direct wafer bonding, consistent with an illustrative embodiment.

FIG. 5 is a cross-section view of a semiconductor structure 500 that has been flipped and undergoing a direct wafer bonding, consistent with an illustrative embodiment. For example, a new substrate 502 is introduced and aligned with the flipped structure 400 of FIG. 4 and then bonded with the new substrate 502. The top surface of the substrate 502 and/or the (now) bottom surface of the semiconductor structure 400 is covered with a thin layer of adhesive oxide to facilitate the bonding between the semiconductor structure 400 and the second substrate 502. The combined structure 500 is annealed (e.g., at a temperature of 200 C to 300 C), thereby creating a covalent bond between the oxide layer 430 and the second (e.g., carrier) substrate 502.

Figure 6:
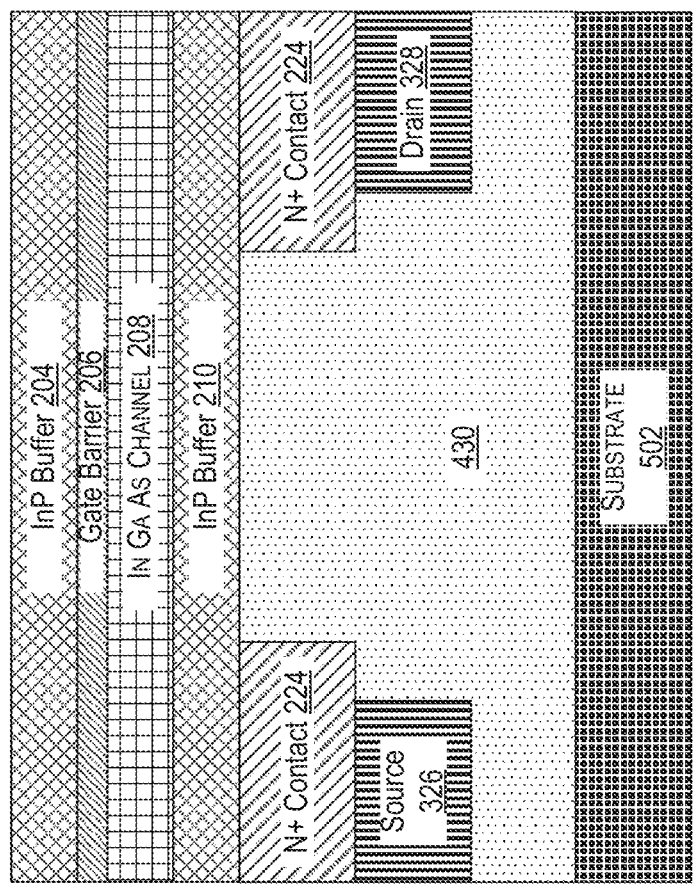
FIG. 6 is a cross-section view of a semiconductor structure, where the first substrate has been removed, consistent with an illustrative embodiment.
Figure 7:
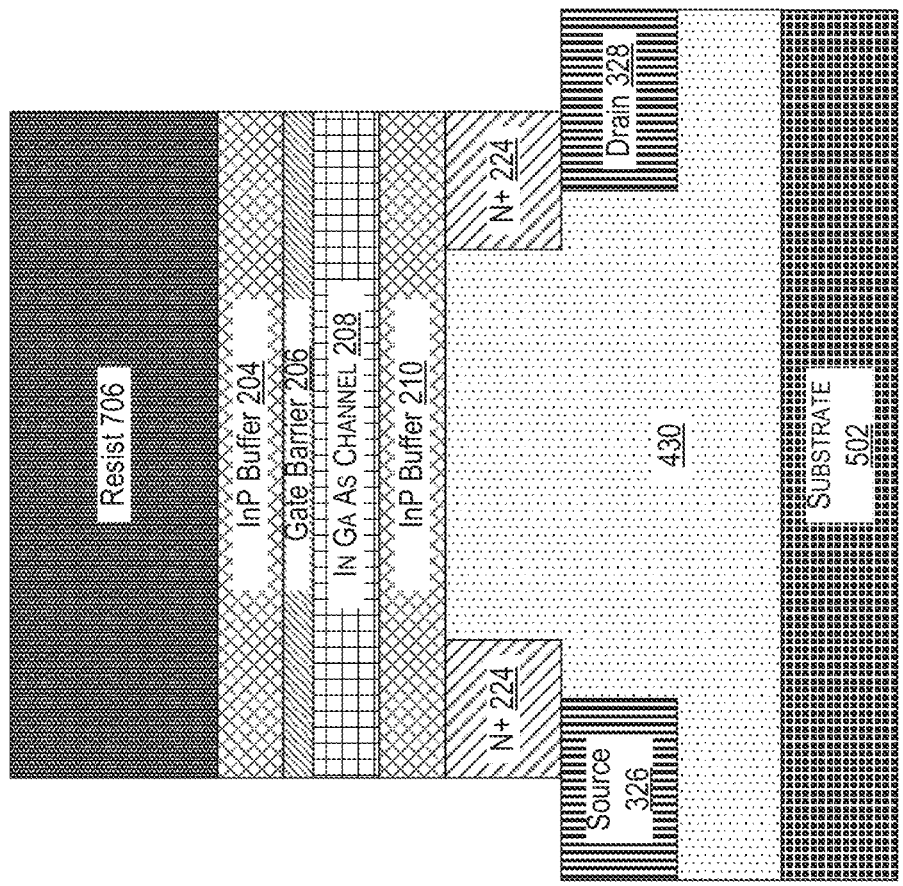
FIG. 7 is a cross-section view of a semiconductor structure having a second photoresist layer applied on top of the first buffer layer and defining the active region by etching, consistent with an illustrative embodiment.

FIG. 6 is a cross-section view of a semiconductor structure 600, where the first substrate has been removed, consistent with an illustrative embodiment. In one embodiment, the first substrate can be removed by way of wafer grinding. In this way, the N+ contacts 224 are now below the gate barrier 206, as well as the transistor channel 208. Next, a second photoresist layer is applied 706 on top of the first buffer layer 204, as illustrated in FIG. 7. Photoresist 706 can be used as an etch mask to define the active region (i.e. the device mesa).

Figure 8:
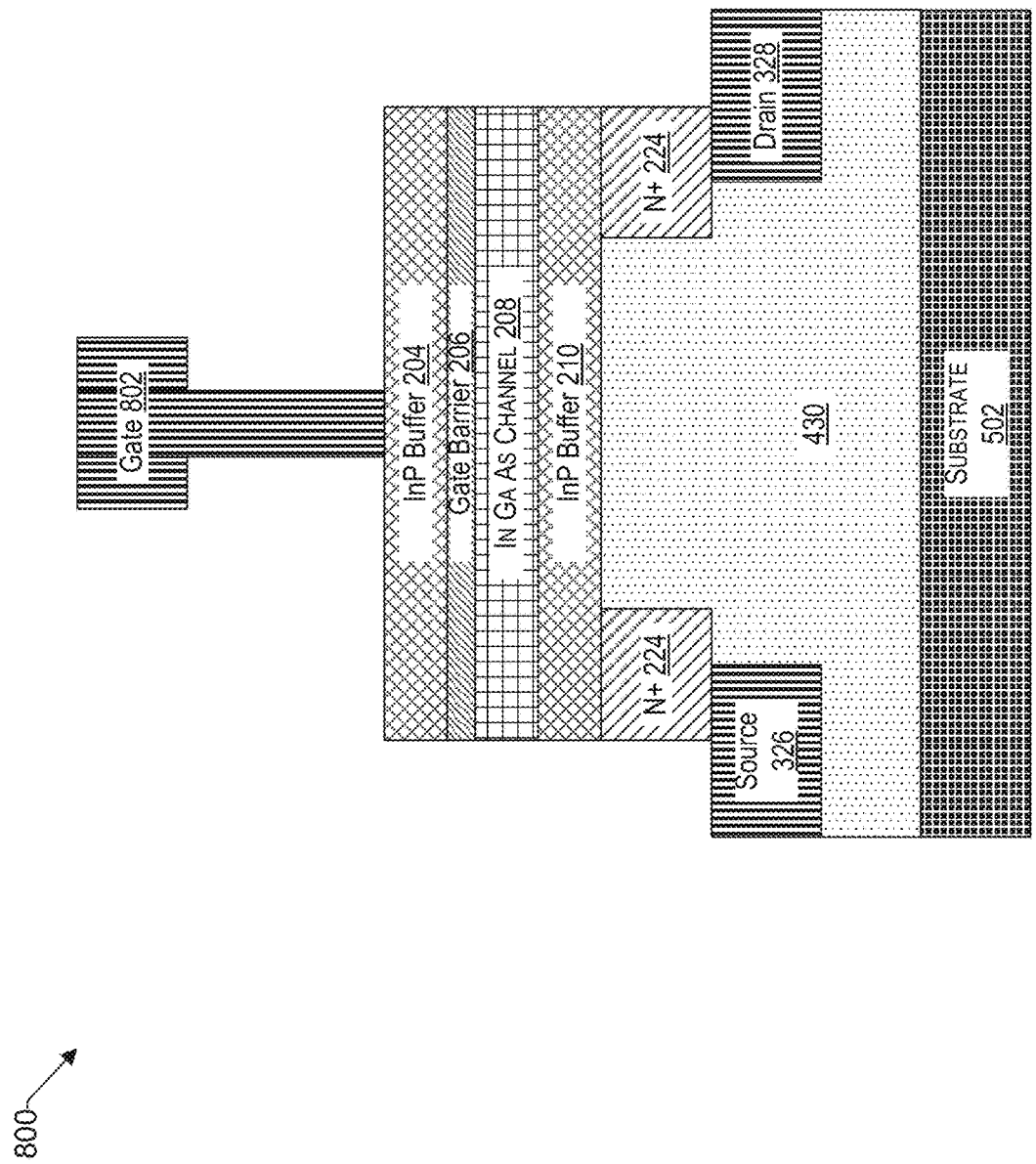
FIG. 8 is a cross-section view of a semiconductor structure having a T shaped gate on top of the first buffer layer, consistent with an illustrative embodiment.

FIG. 8 is a cross-section view of a semiconductor structure 800 having a T shaped gate on top of the first buffer layer 204, consistent with an illustrative embodiment. FIG. 8 illustrates that the semiconductor structure 800 is fabricated in such a way where the source 326 and drain 328 are on a side that is opposite to that of the gate 802 with respect to (separated by) the channel 208.

Example Scenario

FIGS. 9A to 9B provide different aspects of the semiconductor transistor 800 of FIG. 8. More specifically, FIG. 9A provides an example LNA circuit that may use one or more transistors similar to that of FIG. 8, repeated in simplified form 920 in FIG. 9B. The example LNA circuit 902 includes a plurality of transistors 904, 906, and 908 coupled in stages. The remaining components represent BEOL components, such as resistors and capacitors (as well as possible inductors—not shown), to provide a desired bandwidth of operation. For example, for qubit technology the desired bandwidth may be 4 GHz to 8 GHz.

While the manufacture of a single gate HEMT structure is described for the purposes of discussion, it will be understood that other types of transistors and number of gates are supported by the teachings herein. The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a (e.g., quantum) processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor transistor structure, comprising:
a source electrode;
a drain electrode on a same plane as the source electrode;
a channel region on top of the source and drain electrodes and configured to carry a current; and
a gate structure comprising a metallic material on top of the channel region, wherein:
the source and drain electrodes are located on a side that is opposite to that of the gate structure, with respect to the channel region; and
the gate structure is T shaped.

2. The semiconductor transistor structure of claim 1, wherein the channel region comprises indium gallium arsenide (InGaAs).

3. The semiconductor transistor structure of claim 1, wherein the semiconductor transistor structure is a high-electron-mobility transistor (HEMT) and part of a low noise amplifier configured to operate in a cryogenic environment.

4. A semiconductor transistor structure, comprising:
a source electrode;
a drain electrode on a same plane as the source electrode;
a channel region on top of the source and drain electrodes and configured to carry a current;
a gate structure comprising a metallic material on top of the channel region;
a substrate configured as a chip carrier; and
an oxide layer on top of the chip carrier substrate, wherein:
the source and drain electrodes are located on a side that is opposite to that of the gate structure, with respect to the channel region;
the source and drain electrodes are on top of the chip carrier substrate; and
the source and drain electrodes are on a left and a right side of the oxide layer, respectively.

5. The semiconductor transistor structure of claim 4, further comprising:
a first N+ contact on top of the source electrode; and
a second N+ contact on top of the drain electrode.

6. The semiconductor transistor structure of claim 4, further comprising a first buffer layer on top of the oxide and source and drain contacts and below the channel region.

7. The semiconductor transistor structure of claim 6, wherein the first buffer layer comprises indium phosphide (InP).

8. The semiconductor transistor structure of claim 6, further comprising:
a gate barrier on top of the channel region; and
a second buffer layer on top of the gate barrier and below the gate structure.

9. The semiconductor transistor structure of claim 8, wherein the gate barrier comprises indium aluminum arsenide (InAlAs).

10. The semiconductor transistor structure of claim 8, wherein the second buffer layer comprises indium phosphide (InP).

11. A method of fabricating a semiconductor transistor structure, comprising:
providing a first substrate;
providing a first buffer layer on top of the first substrate;
providing a gate barrier layer on top of the first buffer layer;
providing a quantum well channel layer on top of the gate barrier layer;
providing a second buffer layer on top of the quantum well channel layer;
providing a contact layer on top of the second buffer layer;
providing a first photoresist layer having a pattern, on top of the contact layer, to define an etch gate recess region;
removing a center portion of the contact layer below the photoresist pattern, thereby defining a source and a drain on the contact layer;
removing the first photoresist;
depositing an electrode on the drain contact and an electrode on the source contact;
depositing an oxide layer on top of the source and drain electrodes, and the buffer layer;
planarizing the oxide layer;
flipping the transistor structure and direct bonding to a carrier substrate;
removing the first substrate, thereby exposing the first buffer layer;
providing a second photoresist layer having a pattern on top of the exposed first buffer layer;
depositing a metal gate structure on top of the exposed first buffer layer; and
configuring the gate structure to have a T shape.

12. The method of claim 11, wherein the quantum well channel comprises indium gallium arsenide (InGaAs).

13. The method of claim 11, wherein alignment markers are used for the deposition of the electrodes on the drain and source contacts.

14. The method of claim 11, wherein the direct bonding to the carrier substrate comprises:
covering at least one of a surface of the oxide layer or the carrier substrate with a layer of adhesive oxide;
aligning the flipped semiconductor structure with the carrier substrate;
bonding the flipped semiconductor structure with the carrier substrate to create a combined structure; and
annealing the combined structure to create a covalent bond between the oxide layer and the carrier substrate.

15. The method of claim 11, wherein the quantum well channel layer comprises indium gallium arsenide (InGaAs).

16. The method of claim 11, wherein the first buffer layer comprises indium phosphide (InP).

17. The method of claim 11, wherein the gate barrier layer comprises indium aluminum arsenide (InAlAs).

18. The method of claim 11, wherein the second buffer layer comprises indium phosphide (InP).

* * * * *